US010156662B2

(12) United States Patent
Harai

(10) Patent No.: US 10,156,662 B2
(45) Date of Patent: Dec. 18, 2018

(54) LAMINATED FILM, AND METHOD FOR MANUFACTURING COMPOSITE FILM

(71) Applicant: ZEON CORPORATION, Tokyo (JP)

(72) Inventor: Kenichi Harai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 192 days.

(21) Appl. No.: 15/104,907

(22) PCT Filed: Dec. 25, 2014

(86) PCT No.: PCT/JP2014/084388
§ 371 (c)(1),
(2) Date: Jun. 15, 2016

(87) PCT Pub. No.: WO2015/099078
PCT Pub. Date: Jul. 2, 2015

(65) Prior Publication Data
US 2016/0313476 A1 Oct. 27, 2016

(30) Foreign Application Priority Data

Dec. 25, 2013 (JP) .................................. 2013-267684

(51) Int. Cl.
*G02B 1/18* (2015.01)
*C23C 14/22* (2006.01)
(Continued)

(52) U.S. Cl.
CPC .................. *G02B 1/18* (2015.01); *B32B 7/06* (2013.01); *B32B 9/04* (2013.01); *B32B 27/06* (2013.01); *B32B 27/08* (2013.01); *B32B 27/14* (2013.01); *B32B 27/16* (2013.01); *B32B 27/32* (2013.01); *B32B 27/325* (2013.01); *B32B 37/24* (2013.01); *C23C 14/221* (2013.01); *C23C 16/50* (2013.01); *B32B 37/203* (2013.01); *B32B 38/0008* (2013.01); *B32B 38/10* (2013.01); *B32B 2037/246* (2013.01); *B32B 2255/10* (2013.01);
(Continued)

(58) Field of Classification Search
CPC ......... B32B 7/06; B32B 27/325; B32B 27/16; B32B 2307/202; B32B 2457/20; G02B 1/18
USPC ........................................................ 349/122
See application file for complete search history.

(56) References Cited

U.S. PATENT DOCUMENTS 9,219,018 B2    12/2015  Uebayashi et al.
2013/0021667 A1  1/2013  Tsuburaya et al.

FOREIGN PATENT DOCUMENTS

JP    H09-061604 A    3/1997
JP    2007-261052 A   10/2007
(Continued)

OTHER PUBLICATIONS

Apr. 7, 2015 Written Opinion issued in International Application No. PCT/JP2014/084388.
(Continued)

*Primary Examiner* — Fred M Teskin
(74) *Attorney, Agent, or Firm* — Oliff PLC

(57) ABSTRACT

A laminate film including: a substrate film made of an alicyclic olefin resin; and a protection film made of an alicyclic olefin resin and disposed directly on one surface of the substrate film, wherein a surface of the substrate film on a side brought into contact with the protection film, or a surface of the protection film on a side brought into contact with the substrate film is a surface to which activation treatment is applied.

12 Claims, 2 Drawing Sheets

(51) Int. Cl.

| | | |
|---|---|---|
| *C23C 16/50* | (2006.01) | |
| *B32B 9/04* | (2006.01) | |
| *B32B 27/06* | (2006.01) | |
| *B32B 27/14* | (2006.01) | |
| *B32B 27/16* | (2006.01) | |
| *B32B 27/32* | (2006.01) | |
| *B32B 7/06* | (2006.01) | |
| *B32B 27/08* | (2006.01) | |
| *B32B 27/34* | (2006.01) | |
| *B32B 37/24* | (2006.01) | |
| *H01L 51/52* | (2006.01) | |
| *B32B 37/20* | (2006.01) | |
| *B32B 38/00* | (2006.01) | |
| *B32B 38/10* | (2006.01) | |

(52) U.S. Cl.
CPC ....... *B32B 2255/20* (2013.01); *B32B 2264/10* (2013.01); *B32B 2264/102* (2013.01); *B32B 2307/20* (2013.01); *B32B 2307/202* (2013.01); *B32B 2307/7242* (2013.01); *B32B 2307/7265* (2013.01); *B32B 2309/105* (2013.01); *B32B 2457/00* (2013.01); *B32B 2457/20* (2013.01); *B32B 2551/00* (2013.01); *H01L 51/524* (2013.01)

(56) References Cited

FOREIGN PATENT DOCUMENTS

| | | |
|---|---|---|
| JP | 2008-055691 A | 3/2008 |
| JP | 2009-190186 A | 8/2009 |
| TW | 200815192 A | 4/2008 |
| WO | 2012/137662 A1 | 10/2012 |

OTHER PUBLICATIONS

Apr. 7, 2015 International Search Report issued in International Patent Application No. PCT/JP2014/084388.

Jul. 12, 2017 Extended Search Report issued in European Patent Application No. 14875743.8.

LAMINATED FILM, AND METHOD FOR MANUFACTURING COMPOSITE FILM

FIELD

The present invention relates to a laminate film, and a method for manufacturing a composite film using the laminate film.

BACKGROUND

In devices such as a variety of display devices including a display device with an organic electroluminescent element (hereinbelow, this may be referred to as an "organic EL element"), a liquid crystal display device, and an electronic paper; light source devices including an illumination light source device; and devices including a solar cell, use of a film having a barrier function for preventing permeation of water and oxygen for the purpose of, e.g., protecting elements that constitute the device has been known.

As such a film, use of a film having low moisture permeability (the ratio of water permeation) is preferable. Known as an example of such a film is a composite film including a substrate film combined with an inorganic layer that is made of a variety of inorganic materials and is formed on the substrate film (for example, Patent Literature 1).

CITATION LIST

Patent Literature

Patent Literature 1: Japanese Patent Application Laid-open No. 2009-190186 A

SUMMARY

Technical Problem

There has been recently a demand for reducing the thickness of the composite film aiming at downsizing of a device. The inventor of the present invention has therefore attempted to manufacture a thin composite film, by using a thin substrate film and forming the inorganic layer thereon. However, the inventor found out that reduction in thickness of the substrate results in difficulty in stable formation of the inorganic layer.

The inorganic layer is often formed using a method such as sputtering and chemical vapor deposition (CVD). It is usually desired to perform such a method for inorganic layer formation with a high output power for improving film quality of the inorganic layer. However, the inorganic layer formation with a high output power renders high incident energy of the atoms and the molecules contributing to the film formation onto the substrate, and results in a significant level of damage, especially thermal damage, to the substrate. When a thin substrate film is used, the substrate film can fail to tolerate such thermal damage and the substrate film may cause deformation such as wrinkle formation, and floating of the substrate film off the conveying roller for conveying the substrate film may occur to hinder stable conveyance of the substrate film. The floating of the substrate film off the conveying roller herein is a phenomenon in which a gap occurs between a part of the area of the substrate film and the conveying roller, and thereby the substrate film partially leaves the conveying roller. When a thin substrate film is used, therefore, stable formation of the inorganic layer on the substrate film has been difficult.

Possible means for avoiding such failure may be lowering of the output power of the coating device upon the inorganic layer formation. Inorganic layers formed with low output power, however, tend to have a low density, and thus have a low film quality. Such an inorganic layer with a low film quality exhibits low performance in, e.g., barrier property and electroconductivity. Furthermore, when the inorganic layer is formed with a low output power, the production speed may be lowered.

The present invention is conceived in consideration of the aforementioned problems, and an object of the present invention is to provide a laminate film including a substrate film and an inorganic layer that can have a reduced thickness of the substrate film and that enables stable manufacture of a composite film including the inorganic layer formed with a high output power; and a manufacturing method enabling manufacture of a composite film including a substrate film and an inorganic layer that can have a reduced thickness of the substrate film, and has the inorganic layer formed with a high output power.

Solution to Problem

As a result of earnest studies for solving the aforementioned problems, the inventor found out that a laminate film including a substrate film made of an alicyclic olefin resin and a protection film made of an alicyclic olefin resin that are laminated directly to each other onto their surfaces to which the activation treatment is applied is capable of having reduced thickness of the substrate film, and facilitates formation of an inorganic layer on the substrate film with a high output power. The inventor has thus completed the present invention.

That is, the present invention is as follows.

(1) A laminate film comprising:
a substrate film made of an alicyclic olefin resin; and
a protection film made of an alicyclic olefin resin and disposed directly on one surface of the substrate film, wherein
a surface of the substrate film on a side brought into contact with the protection film, or a surface of the protection film on a side brought into contact with the substrate film is a surface to which activation treatment is applied.

(2) The laminate film according to (1), wherein the activation treatment is at least one selected from the group consisting of plasma treatment, corona treatment, ultraviolet ozone treatment, and combustion chemical vapor deposition.

(3) The laminate film according to (1) or (2), further comprising an inorganic layer on a surface of the substrate film on a side opposite to the side of the protection film.

(4) The laminate film according to (3), wherein the inorganic layer includes at least one selected from the group consisting of metal oxide, metal nitride, and metal oxide nitride.

(5) The laminate film according to (3) or (4), wherein the inorganic layer includes a barrier layer.

(6) The laminate film according to any one of (3) to (5), wherein the inorganic layer includes an electroconductive membrane.

(7) The laminate film according to any one of (1) to (6), wherein the surface to which the activation treatment is applied has a pure water contact angle of less than 80°.

(8) A method for manufacturing a composite film including a substrate film and an inorganic layer, the method comprising:

forming an inorganic layer on a surface of a laminate film, the laminate film including a substrate film made of an alicyclic olefin resin and a protection film that is made of an alicyclic olefin resin and that is disposed directly on one surface of the substrate film, the surface of the laminate film being a surface of the substrate film on a side opposite to a side of the protection film; and peeling off the protection film from the substrate film, wherein a surface of the substrate film on a side brought into contact with the protection film, or a surface of the protection film on a side brought into contact with the substrate film is a surface to which activation treatment is applied.

Advantageous Effects of Invention

With the laminate film according to the present invention, a composite film including a substrate film and an inorganic layer that can have a reduced thickness of the substrate film, and has an inorganic layer formed with a high output power can be stably manufactured.

With the method for manufacturing a composite film according to the present invention, a composite film including a substrate film and an inorganic layer that can have a reduced thickness of the substrate film, and has an inorganic layer formed with a high output power can be manufactured.

DESCRIPTION OF EMBODIMENTS

Figure 1:
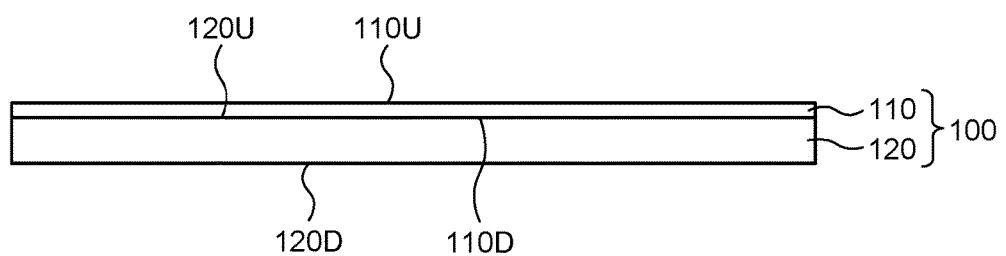
FIG. 1 is a sectional view schematically illustrating an example of a layer structure of a laminate film before an inorganic layer is formed, used in a manufacturing method according to an example of the present invention.

The present invention will now be explained in detail by descriptions of embodiments and examples. The present invention is however not limited to the embodiments and the examples described below, and may be implemented with any modification within the scope not deviating from the scope of the claims and equivalents thereto.

In the explanation below, the term "(meth)acryl-" includes acryl- and methacryl-. The term "(meth)acrylate" includes acrylate and methacrylate.

[1. Overview]

The laminate film according to the present invention is a film including a substrate film and a protection film. This laminate film according to the present invention is usually used in manufacturing a composite film including a substrate film and an inorganic layer.

[2. Laminate Film]

The laminate film according to the present invention includes a substrate film, and a protection film directly disposed on a surface of the substrate film. The protection film being "directly" disposed on a surface of the substrate film means that there is no layer such as a layer of adhesive agent or pressure-sensitive adhesive agent interposed between the protection film and the substrate film.

The substrate film and the protection film are laminated with the aid of activation treatment. That is, to the surface of the substrate film to be brought into contact with the protection film, or to the surface of the protection film to be brought into contact with the substrate film, an activation treatment is applied. The substrate film and the protection film are laminated, facing the surfaces to which the activation treatment is applied. Regarding this feature, the surface of the substrate film to be brought into contact with the protection film may be the surface to which the activation treatment is applied, or the surface of the protection film to be brought into contact with the substrate film may be the surface to which the activation treatment is applied. Alternatively, both the surface of the substrate film to be brought into contact with the protection film and the protection film to be brought into contact with the substrate film may be the surfaces to which the activation treatment is applied.

[2.1. Substrate Film]

The substrate film is made of an alicyclic olefin resin. The alicyclic olefin resin is a resin containing alicyclic olefin polymer, and, if necessary, may also contain another optional component.

The alicyclic olefin polymer is an amorphous thermoplastic polymer with a main chain and/or a side chain having an alicyclic structure. The alicyclic olefin polymer usually has a structure that is a resultant of polymerization of the alicyclic olefin. By using a substrate film made of an alicyclic olefin resin, a composite film with a good barrier function can be obtained. More specifically, as the alicyclic olefin resin has low hygroscopicity, the alicyclic olefin resin can exhibit a mechanical strength as a substrate film and a high water vapor barrier function, and can improve the barrier function of the composite film.

The alicyclic structure included in the alicyclic olefin polymer may have a saturated alicyclic hydrocarbon (cycloalkane) structure, or an unsaturated alicyclic hydrocarbon (cycloalkene) structure. From the viewpoint of mechanical strength, heat tolerance, and the like, the cycloalkane structure is preferable. The number of carbon atoms constituting one alicyclic structure is usually four or more, preferably five or more, and usually 30 or less, preferably 20 or less, and more preferably 15 or less. It is preferable that the number of carbon atoms constituting one alicyclic structure falls within the range, because properties such as mechanical strength, heat tolerance, film formability, and the like are thereby highly balanced.

The ratio of structural units having an alicyclic structure in the entire alicyclic olefin polymer is preferably 55% by weight or more, more preferably 70% by weight or more, and particularly preferably 90% by weight or more. It is preferable that the ratio of the structural units having an alicyclic structure in the alicyclic olefin polymer falls within this range from the viewpoint of transparency and heat tolerance.

Examples of the alicyclic olefin polymer may include norbornene polymer, monocyclic olefin polymer, cyclic conjugated diene polymer, vinyl alicyclic hydrocarbon polymer, and hydrogen-added products thereof. Among those listed herein, norbornene polymer may be preferably used because norbornene polymer exhibits good transparency and formability.

Examples of the norbornene polymer may include a ring-opening polymer of a monomer having a norbornene structure, a ring-opening copolymer of a monomer having a norbornene structure and an optional monomer, and hydrogen-added products thereof; and an addition polymer of a monomer having a norbornene structure, an addition copolymer of a monomer having a norbornene structure and an optional monomer, and hydrogen-added products thereof. Among those listed herein, the hydrogen-added product of the ring-opening (co)polymer of a monomer having a norbornene structure is particularly preferable from the viewpoint of formability, heat tolerance, low hygroscopicity, dimensional stability, and lightness. The term "(co)polymer" herein may include the polymer as well as the copolymer.

Examples of the monomers having a norbornene structure may include bicyclo[2.2.1]hept-2-ene (common name: norbornene), tricyclo[4.3.0.1$^{2,5}$]deca-3,7-diene (common name: dicyclopentadiene), 7,8-benzotricyclo[4.3.0.1$^{2,5}$]deca-3-ene (common name: methano-tetrahydrofluorene), tetracyclo[4.4.0.1$^{2,5}$0.1$^{7,10}$]dodeca-3-ene (common name: tetracyclododecene), and derivatives of these components (e.g., those with a substituent in the ring). Examples of the substituent may include alkyl group, alkylene group, and polar group. A plurality of the same or different substituents may be bound to the ring. Furthermore, as the monomer having a norbornene structure, one type thereof may be solely used, and two or more types thereof may also be used in combination at any ratio.

Exemplary types of the polar group may include a heteroatom, and a group of atoms having a heteroatom. Examples of the heteroatom may include an oxygen atom, a nitrogen atom, a sulfur atom, a silicon atom, and a halogen atom. Specific examples of the polar group may include carboxy group, carbonyl oxy carbonyl group, epoxy group, hydroxy group, oxy group, ester group, silanol group, silyl group, amino group, nitrile group, and sulfonate group.

Examples of the optional monomer capable of undergoing ring-opening copolymerization with the monomer having a norbornene structure may include monocyclic olefin such as cyclohexene, cycloheptene, and cyclooctene and their derivatives; cyclic conjugated diene such as cyclohexadiene and cycloheptadiene, and their derivatives. As the optional monomer capable of undergoing ring-opening copolymerization with the monomer having a norbornene structure, one type thereof may be solely used, and two or More types thereof may also be used in combination at any ratio.

The ring-opening polymer of a monomer having a norbornene structure, and the ring-opening copolymer of a monomer having a norbornene structure and an optional monomer that is capable of undergoing copolymerization may be manufactured by, e.g., effecting polymerization or copolymerization of the monomer in the presence of a publicly known ring-opening polymerization catalyst.

Examples of the optional monomer capable of undergoing addition copolymerization with the monomer having a norbornene structure may include α-olefin having 2 to 20 carbon atoms such as ethylene, propylene, and 1-butene, and their derivatives; cycloolefin such as cyclobutene, cyclopentene, and cyclohexene, and their derivative; unconjugated diene such as 1,4-hexadiene, 4-methyl-1,4-hexadiene, and 5-methyl-1,4-hexadiene. Among those listed herein, α-olefin is preferable, and ethylene is more preferable. As the optional monomer capable of undergoing addition copolymerization with the monomer having a norbornene structure, one type thereof may be solely used, and two or more thereof may also be used in combination at any ratio.

The addition polymer of a monomer having a norbornene structure, and the addition copolymer of a monomer having a norbornene structure and an optional monomer that is capable of undergoing copolymerization may be manufactured by, e.g., effecting polymerization or copolymerization of the monomer in the presence of a publicly known addition polymerization catalyst.

The hydrogen-added products of the polymer such as the ring-opening polymer of the monomer having a norbornene structure, and the ring-opening copolymer of the monomer having a norbornene structure and the monomer capable of undergoing ring-opening copolymerization therewith; and the addition polymer of the monomer having a norbornene structure, and the addition copolymer of the monomer having a norbornene structure and the monomer capable of undergoing copolymerization therewith may be manufactured using any manufacturing method. The hydrogen-added products of such polymer may be manufactured by hydrogenating the carbon-carbon unsaturated bonds, preferably 90% or higher thereof, in a solution of such a polymer, in the presence of a known catalyst for hydrogenation containing a transition metal such as nickel or palladium.

The molecular weight of the alicyclic olefin polymer in the alicyclic olefin resin is appropriately selected in accordance with the application. The weight-average molecular weight (Mw) of the alicyclic olefin polymer is usually 10,000 or more, preferably 15,000 or more, and more preferably 20,000 or more, and is usually 100,000 or less, preferably 80,000 or less, and more preferably 50,000 or less. The weight-average molecular weight within the range is preferable because thereby, e.g., the mechanical strength of the resulting substrate film and the forming workability can be highly balanced. The weight-average molecular weight of the alicyclic olefin polymer may be measured in terms of polyisoprene using gel permeation chromatography with use of cyclohexane as a solvent. When polymer does not dissolve in cyclohexane, toluene may be used as a solvent. When toluene is used as the solvent, the weight-average molecular weight may be measured in terms of polystyrene.

The ratio of the alicyclic olefin polymer in the alicyclic olefin resin is preferably 67% by weight to 100% by weight, and more preferably 77% by weight to 100% by weight.

The alicyclic olefin resin may contain, as an alicyclic olefin polymer, only one polymer, and may also contain two or more polymers in combination at any ratio. The substrate film may be made of a plurality of layers of the alicyclic olefin resin. When the substrate film includes a plurality of layers of the alicyclic olefin resin, the alicyclic olefin resin constituting each of the layers may be the same as that of another layer, and the alicyclic olefin resin used in one layer may also be different from that of another layer.

Examples of the optional component in the alicyclic olefin resin may include additives such as antioxidant, thermal stabilizer, light stabilizer, ultraviolet absorber, antistatic agent, dispersant, chlorine scavenger, flame retardant, crystal nucleating agent, intensifier, anti-blocking agent, anti-fog additive, mold releasing agent, colorant, organic or inorganic filler, neutralizer, lubricant, decomposition agent, metal deactivator, fouling inhibitor, antibacterial agent, an optional polymer, and thermoplastic elastomer.

These additives may be added in an amount within a range in which the effects of the present invention are not significantly impaired. For example, the amount of the additive is usually 0 part by weight to 50 parts by weight, and preferably 0 part by weight to 30 parts by weight, with respect to the 100 parts by weight of the alicyclic olefin polymer in the alicyclic olefin resin.

The alicyclic olefin resin is not limited to those with high transparency. It is, however, preferable that the alicyclic olefin resin is highly transparent from the viewpoint of rendering the composite film useful for parts of a display device or a light source device in which the parts are required to allow light to pass therethrough. For example, the alicyclic olefin resin preferably has a transparency to a degree such that a test piece thereof having a thickness of 1 mm has a total light transmittance of usually 70% or higher, preferably 80% or higher, and more preferably 90% or higher.

The heat distortion temperature of the alicyclic olefin resin is preferably 100° C. or higher, and more preferably 120° C. or higher. With such a heat distortion temperature, the risks of the protection film being peeled off from the substrate film can be reduced during the formation of the inorganic layer. The upper boundary of the heat distortion temperature of the alicyclic olefin resin is not particularly limited, but may be 300° C. or lower.

The method for forming the alicyclic olefin resin into a substrate film is not particularly limited. For example, the substrate film may be manufactured by forming the resin into a film by, e.g., melt molding and solution casting. A commercially available film made of an alicyclic olefin resin may also be used.

The substrate film may be a stretched film to which stretching treatment is applied, or may be an unstretched film to which stretching treatment is not applied.

The thickness of the substrate film may be set in accordance with the application of the composite film, but it is preferable that the substrate film is thin from the viewpoint of achieving a thin composite film. The specific range of the substrate film thickness is preferably 150 μm or less, more preferably 125 μm or less, and particularly preferably 100 μm or less. The lower boundary is usually 10 μm or more, preferably 15 μm or more, and more preferably 20 μm or more, from the viewpoint of handling ability, although there is no limitation thereto.

The surface of the substrate film to be brought into contact with the protection film may be the surface to which activation treatment is applied. That is, the surface of the substrate film to be brought into contact with the protection film may be subjected to activation treatment before being laminated to the surface of the protection film.

Generally, because a film made of an alicyclic olefin resin has a low adhesion property, it is difficult to achieve stable lamination of the films made of an alicyclic olefin resin simply by compressing. By contrast, when the substrate film has a surface to which activation treatment is applied as described above, stable lamination between the substrate film and the protection film can be ensured. Consequently, the risks of the protection film being peeled off from the substrate film during the formation of the inorganic layer can be reduced. Furthermore, because the substrate film and the protection film are laminated without any layer such as a layer of adhesive agent or pressure-sensitive adhesive agent interposed therebetween, the protection film can be peeled off easily from the substrate film after the formation of the inorganic layer.

The substrate film surface to which activation treatment is applied is activated, and the wettability for water is usually increased compared with that before the activation treatment. The degree of the activation may be evaluated by wettability. The degree of the activation may be represented by, e.g., a water contact angle. Specifically, the pure water contact angle of the surface of the substrate film to which activation treatment is applied is preferably less than 80°, more preferably 50° or less, and particularly preferably 40° or less, and is preferably 10° or more. By keeping the pure water contact angle of the surface to which activation treatment is applied less than the upper boundary of the range specified above, the adhesion between the substrate film and the protection film can be effectively improved. The contact angle may be measured by, e.g., "DropMaster" manufactured by Kyowa Interface Science Co., Ltd.

When the surface of the protection film to be brought into contact with the substrate film is the surface to which activation treatment is applied, the surface of the substrate film to be brought into contact with the protection film does not necessarily need to be subjected to the activation treatment. However, even when the surface of the protection film to be brought into contact with the substrate film is the surface to which the activation treatment is applied, it is preferable that the surface of the substrate film to be brought into contact with the protection film is also subjected to the activation treatment.

Examples of the activation treatment may include plasma treatment such as atmospheric pressure plasma treatment and vacuum plasma treatment, corona treatment, UV ozone treatment, and combustion chemical vapor deposition. The combustion chemical vapor deposition herein means flame treatment with an organosilicon compound introduced. The plasma treatment and the corona treatment are particularly preferable because of their short treatment time and excellent productivity.

The plasma treatment is treatment for activating the surface by generating plasma discharge in an atmosphere of a gas such as an inert gas or an oxygen gas at the atmospheric pressure or a reduced pressure. The degree of the pressure reduction may be, e.g., 0.1 Torr to 1 Torr. The atmospheric pressure plasma treatment which is treatment at the atmospheric pressure is preferable, so that the surface can be treated efficiently while the film is conveyed on a roll.

Because the plasma treatment can modify the treated surface variously depending on the gas type, it is preferable to appropriately select the gas type used in the treatment. Examples of the gas type may include nitrogen; oxygen; noble gas such as argon or helium; acrylic acid; hydroxyalkyl; and fluorine-based compound such as $CF_4$, $CHF_3$ and $C_2F_6$. As the gas, one type thereof may be solely used, and two or more types thereof may also be used in combination at any ratio. Examples of preferable gas may include mixed gas which is a mixture of an inert gas, such as argon, with 10% or so of oxygen.

The plasma output power for the plasma treatment is preferably set to a range from 0.2 kW to 3 kW. The conveyance speed of the film to be subjected to the plasma treatment is preferably 3 m/min to 70 m/min, and more preferably 3 m/min to 50 m/min. A preferable range of the frequency is 10 kHz to 100 kHz. The treatment time may be, e.g., about 3 minutes.

The corona treatment is a method for treating a film surface by applying a high voltage between insulated electrodes with a dielectric material at a high frequency to thereby generate corona, and passing the film through the gap between the dielectric material and the electrode. Generally, adhesion property is given to the surface to which the corona treatment is applied, and the degree of the adhesion property is dependent on the electrode type, the electrode gap, the voltage, the humidity, and the type of the film to be treated. As the material for the electrode, e.g., ceramic and aluminum are preferable. The distance between the electrode and the dielectric material is preferably from 1 mm to 5 mm, and more preferably from 1 mm to 3 mm. The conveyance speed of the film to be subjected to the corona treatment is preferably 3 m/min to 70 m/min, and preferably 3 m/min to 50 m/min. The corona output power is preferably 0.2 kW or higher, and more preferably 0.5 kW or higher, and is preferably 3 kW or lower, and more preferably 1.5 kW or lower. By setting the corona output power to a level equal or higher than the lower boundary of the range mentioned above, the corona discharge can be stabilized, and the adhesion force given to the surface to which corona treatment is applied can be stabilized. Furthermore, by setting the corona output power to a level equal to or lower than the upper boundary, damages of the film to which the corona treatment is applied can be suppressed. The treatment time may be, e.g., about 2 minutes.

[2.2. Protection Film]

The protection film is made of the alicyclic olefin resin. As the alicyclic olefin resin with which the protection film is formed, any of those explained to fall within the scope of the possible materials for the substrate film may be used. An alicyclic olefin resin that is different from that used for the substrate film may be employed as the alicyclic olefin resin for the protection film. However, it is preferable that an alicyclic olefin resin that is the same as the resin for the substrate film is employed as the alicyclic olefin resin for the protection film. By such an employment, the same linear expansion coefficient can be achieved in the substrate film and the protection film, and deformation such as warping and wrinkling of the laminate film according to the present invention can thereby be suppressed. Consequently, behaviors of the laminate film during the formation of the inorganic layer can be stabilized, and the inorganic layer with a high film quality can be stably manufactured.

The method for forming a protection film using the alicyclic olefin resin is not particularly limited. For example, the same method as that for forming a substrate film with the alicyclic olefin resin may be used.

The protection film may be a stretched film to which stretching treatment is applied, or an unstretched film to which stretching treatment is not applied.

It is preferable that the protection film is thicker than the substrate film, and the protection film is usually 75 μm or more, preferably 100 μm or more, and more preferably 120 μm or more, and is usually 300 μm or less, preferably 250 μm or less, and more preferably 200 μm or less. By setting the thickness of the protection film to a thickness equal to or more than the lower boundary of the range mentioned above, the mechanical strength of the laminate film according to the present invention can be improved. Consequently, deformation of the laminate film can be prevented, and the inorganic layer can be stably formed when the inorganic layer is formed. Furthermore, the risks of the protection film being peeled off from the substrate film during the formation of the inorganic layer can be reduced. Furthermore, by setting the thickness of the protection film to a thickness equal to or less than the upper boundary, the film can be conveyed easily during the formation of the inorganic layer. Specifically, occurrence of floating of the film off the roll supporting the film conveyance can be effectively suppressed. In a configuration in which the protection film has a multi-layered structure including a plurality of resin layers, it is preferable that the total thickness of the layers is within the range mentioned above.

A ratio T2/T1 of a thickness T2 of the protection film with respect to a thickness T1 of the substrate film is usually 1 or more, preferably 1.1 or more, and more preferably 1.25 or more, and is usually 6 or less, preferably 5 or less, and more preferably 4 or less. By setting the thickness ratio T2/T1 to a ratio equal to or more than the lower boundary of the range mentioned above, the mechanical strength of the laminate film can be improved. Furthermore, by setting the thickness ratio T2/T1 to a ratio equal to or less than the upper boundary, flexibility allowing roll-to-roll conveyance can be maintained.

The surface of the protection film to be brought into contact with the substrate film may be the surface to which the activation treatment is applied. That is, the surface of the protection film to be brought into contact with the substrate film may be subjected to the activation treatment before being laminated to the substrate film surface. By providing the protection film with such a surface to which the activation treatment is applied, stable lamination between the substrate film and the protection film can be ensured. Consequently, the risks of the protection film being peeled off from the substrate film during the formation of the inorganic layer can be reduced. Furthermore, because the substrate film and the protection film are laminated together without any layer such as a layer of adhesive agent or pressure-sensitive adhesive agent interposed therebetween, the protection film can be peeled off easily from the substrate film after the formation of the inorganic layer.

The protection film surface to which the activation treatment is applied is activated, and the wettability for water is usually increased compared with that before the activation treatment. The degree by which the surface of the protection film to which the activation treatment is applied is activated can be therefore represented by a water contact angle, in the same manner as the surface of the substrate film to which the activation treatment is applied. The pure water contact angle of the protection film surface to which the activation treatment is applied is preferably less than 80°, more preferably 50° or less, and particularly preferably 40° or less, and is preferably 10° or more. By keeping the pure water contact angle of the surface to which the activation treatment is applied less than the upper boundary of the range mentioned above, the adhesion between the substrate film and the protection film can be effectively improved.

When the surface of the substrate film to be brought into contact with the protection film is the surface to which the activation treatment is applied, the surface of the protection film to be brought into contact with the substrate film does not necessarily need to be subjected to the activation treatment. However, even when the surface of the substrate film to be brought into contact with the protection film is the surface to which the activation treatment is applied, it is preferable that the surface of the protection film to be brought into contact with the substrate film is also subjected to the activation treatment.

Examples of the activation treatment may include those explained above as the exemplary activation treatment that can be applied to the substrate film. Among such examples, atmospheric pressure plasma treatment and corona treatment are preferable because of their short treatment time and excellent productivity.

[2.3. Optional Layers]

The laminate film according to the present invention may include any film other than the aforementioned substrate film and protection film.

For example, a slip facilitation layer, an antistatic layer, and the like may be provided on the surface of the protection film on the side opposite to the side of the substrate film. It is particularly preferable to have a slip facilitation layer.

As the slip facilitation layer, e.g., a resin layer containing a polymer and particles may be used. Because an adhesion facilitating layer containing such particles has a coarser surface on the side opposite to the side of the protection film, the surface slipping property of the coarser surface can be improved. Therefore, a laminate film having such a slip facilitation layer can have high handling ability, and blocking and wrinkling can be stably suppressed. Blocking herein is a phenomenon in which the surfaces of the film wound as a roll, with the surfaces being held in contact with each other, adhere to each other.

As the polymer that the resin forming the slip facilitation layer contains, e.g., polyurethane may be used. Because poly-polyurethane can adhere firmly to the protection film made of an alicyclic olefin resin which has a low adhesion property, the risks of the slip facilitation layer being peeled off from the protection film during the formation of the inorganic layer can be effectively suppressed.

An example of the polyurethane for use may be a polyurethane obtained by reacting (i) a component having two or more active hydrogens in average per one molecule with (ii) a polyvalent isocyanate component. Another example of the polyurethane for use may be a polyurethane manufactured by chain-extending the pre-polymer obtained from the component (i) and the component (ii) using a chain extending agent, and then adding water thereto, to obtain a dispersion. The aforementioned pre-polymer may be manufactured as pre-polymer containing an isocyanate group by allowing the component (i) to urethanize with the component (ii) in the presence of an excessive isocyanate group. The urethanizing reaction may be performed in an organic solvent being inert for the reaction, and having high affinity with water. Furthermore, the pre-polymer resultant of the urethanizing reaction may be neutralized before chain-extending the pre-polymer. Such polyurethane may include an acid structure. The acid structure may be neutralized entirely or partly.

Such polyurethane is commercially available as a composition containing water and a polymer dispersed in the water. Examples of such a commercially available polyurethane may include "ADEKA BON-TIGHTER" series manufactured by Asahi Denka Kogyo K. K., "OLESTER" series manufactured by Mitsui Toatsu Chemicals, Inc., "Bondic" series and "Hydran" series manufactured by Dainippon Ink and Chemicals, Inc., "Impranil" series manufactured by Bayer AG, "Soflanate" series manufactured by Japan Soflan, "Poiz" series manufactured by Kao Corporation, "SAN-PRENE" series manufactured by Sanyo Chemical Industries, Ltd., "Aizerax" series manufactured by Hodogaya Chemical Co. Ltd., "SuperFlex" series manufactured by DKS Co. Ltd., and "Neorez" series manufactured by Zeneca.

As the polymer, one type thereof may be solely used, and two or more types thereof may also be used in combination at any ratio.

As the particles, any one of inorganic particles and organic particles may be used. Examples of the material of the inorganic particles may include: inorganic oxide such as silica, titania, alumina, and zirconia; and calcium carbonate, talc, clay, fired kaolin, fired calcium silicate, hydrated calcium silicate, aluminum silicate, magnesium silicate, and calcium phosphate. Examples of the material of the organic particles may include silicone resin, fluorine resin, and (meth)acryl-based resin. Among those listed herein, silica is preferable. Silica particles have excellent capability for suppressing wrinkling, and have excellent transparency, and exhibit high dispersibility and dispersion stability in the resin containing polyurethane. Among different types of silica particles, amorphous colloidal silica particles are particularly preferable. As the particles, one type thereof may be solely used, and two or more types thereof may also be used in combination at any ratio.

The average particle diameter of the particles is usually 1 nm or larger, preferably 5 nm or larger, and more preferably 10 nm or larger, and is usually 500 nm or smaller, preferably 300 nm or smaller, and more preferably 200 nm or smaller. By setting the average particle diameter to a diameter equal to or larger than the lower boundary of the range mentioned above, the slipping property of the slip facilitation layer can be effectively improved. Furthermore, by setting the average particle diameter to a diameter equal to or smaller than the upper boundary, the amount of particles falling off from the laminate film can be reduced. As the average particle diameter of the particles, a particle diameter distribution may be measured by laser diffractometry, and the particle diameter at which the volume accumulated from the small diameter sizes in the measured particle diameter distribution reaches 50% may be adopted.

The amount of particles is usually 0.5 part by weight or more, preferably 5 parts by weight or more, and more preferably 8 parts by weight or more, and is usually 20 parts by weight or less, preferably 18 parts by weight or less, and more preferably 15 parts by weight or less, with respect to 100 parts by weight of the polymer. By setting the amount of particles town amount equal to or more than the lower boundary, handling ability of the laminate film can be improved, so that wrinkling of the wound laminate film can be suppressed. Furthermore, by setting the amount equal to or less than the upper boundary, the appearance of the laminate film with no clouding can be maintained.

Furthermore, the slip facilitation layer may include an optional component other than the polymer and the particles. Examples of the optional component may include crosslinking agent, heat resistance stabilizer, weathering stabilizer, leveling agent, surfactant, antioxidant, antistatic agent, slipping agent, anti-blocking agent, antifog additive, lubricant, dye, colorant, natural oil, synthetic oil, and wax. One type thereof may be solely used, and two or more types thereof may also be used in combination at any ratio.

The slip facilitation layer may be manufactured by, e.g., preparing a resin composition containing the polymer, the particles, the solvent, and any optional component if necessary, then applying the resin composition onto the surface of the protection film to form a layer of the resin composition, and then curing the resin composition layer. Furthermore, the surface of the protection film on which the slip facilitation layer is to be formed may be subjected to surface treatment such as activation treatment before the formation of the slip facilitation layer. Water is usually used as the solvent of the resin composition. The resin composition layer may be cured by irradiating the layer with an activation energy ray, such as ultraviolet ray, or by heating. The slip facilitation layer may be formed before the protection film is laminated to the substrate film, and may also be formed after the protection film is laminated to the substrate film.

[3. Intermediate Product Film (Laminate Film with Inorganic Layer)]

As described above, when a composite film using a laminate film including the substrate film and the protection film is manufactured, a step of forming the inorganic layer on the surface of the substrate film of the laminate film on the side opposite to the side of the protection film is performed. The film obtained by the step of forming the inorganic layer is a laminate film including the protection film, the substrate film, and the inorganic layer, in this order. Among the laminate films according to the present invention, the laminate film having the inorganic layer on the surface of the substrate film on the side opposite to the side of the protection film may be appropriately referred to hereinbelow as an "intermediate product film".

[3.1. Inorganic Layer]

The inorganic layer may be a layer that is substantially made of an inorganic material. The layer that is substantially made of an inorganic material is a layer in which the ratio of the inorganic material in the layer is 60% by weight to 100% by weight. The inorganic layer is preferably a layer made only of an inorganic material. Further, the inorganic layer is preferably a layer containing at least one selected from the group consisting of metal oxide, metal nitride and metal oxide nitride. The metal herein is an element including semimetals such as silicon.

Furthermore, the inorganic layer may be a layer having a single-layer structure consisting of one layer, and may also be a layer having a multi-layered structure which has two or more layers.

Examples of the layers included in the inorganic layer may include a barrier layer and an electroconductive membrane. The inorganic layer may include only the barrier layer, may include only the electroconductive membrane, and may also include both of the barrier layer and the electroconductive membrane in combination. When the inorganic layer includes both of the barrier layer and the electroconductive membrane, the inorganic layer usually includes the barrier layer and the electroconductive membrane in this order, from the side nearer to the substrate film.

The barrier layer is a layer having a water-blocking function. Specifically, the barrier layer is a layer having a water vapor transmission rate of usually 1.0 g/m$^2$ day or less, preferably 0.2 g/m$^2$ day or less, and more preferably 0.1 g/m$^2$ day or less. When the composite film is provided with an inorganic layer having such a barrier layer, a member having the composite film can be protected against deterioration caused by water.

Examples of the inorganic material with which the barrier layer is formed may include metal oxide, metal nitride, and metal oxide nitride that include silicon or aluminum as a metallic element. Among these materials, metal oxide, metal nitride, and metal oxide nitride including silicon are particularly preferable.

An exemplary composition of metal oxide, metal nitride, and metal oxide nitride including silicon is a composition represented by SiOx ($1.5<x<1.9$), SiNy ($1.2<y<1.5$) and SiOxNy ($1<x<2$ and $0<y<1$). By using an inorganic material having such a composition, better properties, such as transparency and barrier property can be achieved.

Furthermore, one type thereof may be solely used, and two or more types thereof may also be used in combination at any ratio.

The thickness of the barrier layer is preferably 3 nm or more, more preferably 10 nm or more, and is preferably 2,000 nm or less, more preferably 1,000 nm or less.

Examples of a method for forming the barrier layer may include vapor deposition, sputtering, ion plating, ion beam assisted deposition, arc discharge plasma vapor deposition, thermal CVD, and plasma CVD. Among those alternatives, use of arc discharge plasma vapor deposition is preferable because evaporation particles with appropriate energy are generated, so that a highly dense film can be formed. Furthermore, when a barrier layer containing a plurality of types of components is to be formed, such components may be vapor-deposited or sputtered simultaneously.

The electroconductive membrane is a membrane having a surface resistance of 1000Ω/□ or lower. By providing an inorganic layer including the electroconductive membrane, the function of an electrode can be given to the composite film.

Examples of the inorganic material with which the electroconductive membrane is formed may include ITO (indium tin oxide), IZO (indium zinc oxide), ZnO (zinc oxide), IWO (indium tungsten oxide), ITiO (indium titanium oxide), AZO (aluminum zinc oxide), GZO (gallium zinc oxide), XZO (zinc-based special oxide), and IGZO (indium gallium zinc oxide). One type thereof may be solely used, and two or more types thereof may also be used in combination at any ratio.

The thickness of the electroconductive membrane is preferably 30 nm or more, more preferably 50 nm or more, and is preferably 250 nm or less, and more preferably 220 nm or less.

Examples of the method for forming the electroconductive membrane may include sputtering and vapor deposition.

[3.2. Optional Layers that May be Provided to Intermediate Product Film]

The intermediate film may be provided with other optional layers in addition to those explained above.

For example, the intermediate film may be provided with an optional layer on a surface of the inorganic layer, on the side opposite to the side of the substrate film. Specific examples of such an optional layer may include an antistatic layer, a hard coat layer, and a fouling prevention layer. Examples of methods for providing such an optional layer may include a method of applying a material of the optional layer onto the inorganic layer and curing the material, and a method of causing the optional layer to be laminated to the inorganic layer by thermocompression.

[4. Composite Film Manufacturing Method]

When a composite film using the laminate film described above is to be manufactured, for example, the manufacturing method to be carried out may include: a step of forming an inorganic layer on the surface of the substrate film of the laminate film, which includes the substrate film and the protection film, on the side opposite to the side of the protection film, to thereby obtain an intermediate product film; and a step of peeling off the protection film from the substrate film of the intermediate product film, to thereby obtain a composite film including the substrate film and the inorganic layer.

The inorganic layer may be formed using any of the methods that have been enumerated as examples in the section explaining the inorganic layer. At this time, because the laminate film according to the present invention is provided not only with a substrate film but also with a protection film, deterioration of the substrate film due to the thermal damage can be avoided, and floating of the substrate film off the conveyance roll can be prevented, even if the inorganic layer is formed with a method using a high output power. Furthermore, because the substrate film and the protection film are laminated after the activation treatment, the risks of the protection film being peeled off from the substrate film can be reduced, even if the inorganic layer is manufactured with a high output power. Consequently, an inorganic layer can be stably formed with a high output power, while using a thin substrate film. As a result, an inorganic layer having high film quality can be quickly manufactured.

The composite film may be obtained by peeling off the protection film from the substrate film, after the inorganic layer is formed in the manner described above. Because the substrate film is laminated directly to the protection film, without any layer such as a layer of adhesive agent or of pressure-sensitive adhesive agent interposed therebetween, the protection film can be peeled off from the substrate film quickly and easily.

The activation treatment applied for lamination of the substrate film with the protection film usually exhibits a nature such that the sticking strength is deteriorated in a highly humid environment, enabling facilitation of the peeling of the protection film from the substrate film easily. Therefore, the step of peeling off the protection film from the substrate film is preferably performed in a highly humid environment.

Furthermore, the method for manufacturing a composite film may include an optional step other than those described above. For example, the method for manufacturing a composite film may include a step of forming an optional layer on the surface of the inorganic layer on the side opposite to the side of the substrate film, or a step of forming an optional layer on the surface of the substrate film on the side opposite to the side of the inorganic layer. Furthermore, the method may include a step of, e.g., cutting the resulting composite film into a desirable shape.

The composite film that may be obtained in this manner includes a substrate film and an inorganic layer. Because the thickness of the substrate film can be reduced in the composite film, the thickness of the entire composite film can be reduced.

Furthermore, because the inorganic layer of the composite film is formed using a film forming method which uses a high output power, the inorganic layer has a high film quality. Consequently, the inorganic layer can exhibit excellent performance which is expected for the inorganic layer to have.

For example, when the composite film is provided with a barrier layer as the inorganic layer, the composite film can sufficiently exhibit excellent water vapor blocking performance that the barrier layer has. Consequently, the entire composite film can realize reduced water vapor transmission rate. Specifically, the water vapor transmission rate of the entire composite film may be $1 \times 10^{-6}$ g/m² day to $1 \times 10^{-2}$ g/m² day.

Furthermore, the composite film usually has excellent transparency. Specifically, the total light transmittance of the composite film is usually 85% to 100%, and preferably 90% to 100%. The light transmittance may be measured in accordance with JIS K0115, using a spectrophotometer (an ultraviolet-visible-near infrared spectrophotometer "V-570" manufactured by JASCO Corporation).

Although the haze of the composite film is not particularly limited, it is generally preferable that the composite film has a low haze when the composite film is used for optical applications in which light scattering is not particularly intended. Specifically, the haze level of the composite film may be preferably 3.0% or lower, and more preferably 1.0% or lower. The haze may be measured in accordance with JIS K7136-1997.

The composite film may be manufactured as a long-length film. For manufacturing such a long-length composite film, long-length films may be used as the substrate film and the protection film. A long-length film herein means a film having a size in the length direction that is 10 times or more, preferably 50 times or more, and more preferably 100 times or more the size in the width direction. Such a long-length film may be stored and transported in a roll shape (roll).

Because a roll-to-roll operation can be used in forming the inorganic layer on the composite film using a high output power, the inorganic layer can be efficiently manufactured. The roll-to-roll operation herein is an operation in which the treatment is continuously applied to the film that is fed from a feed roll, and the treated film is wound as a product roll.

The composite film manufactured as the long-length film may be cut into a desirable shape, as required.

[5. Specific Example of Method for Manufacturing Composite Film]

A preferred example of the method for manufacturing a composite film according to the present invention is a method including: a step I of applying the activation treatment to the surface of the substrate film, the step II of applying the activation treatment to the surface of the protection film, the step III of laminating the substrate film and the protection film with the surfaces to which the activation treatment is applied facing each other, a step IV of forming the inorganic layer on the surface of the substrate film on the side opposite to the side of the protection film, and a step V of peeling off the protection film from the substrate film. This method will now be explained hereinbelow.

FIG. 1 is a sectional view schematically illustrating an example of the layer structure of the laminate film before the inorganic layer is formed, used in the manufacturing method according to an example of the present invention. In the following description, the laminate film before the inorganic layer is formed may be appropriately referred to as a "support film". In the following, explanation will be presented referring to a method for manufacturing a composite film using a support film having the structure illustrated in FIG. 1 as an example.

In FIG. 1, a support film 100 includes a substrate film 110, and a protection film 120 that is directly disposed on one surface 110D of the substrate film 110. The protection film 120 may also be provided with any other optional layer such as a slip facilitation layer, on a surface 120D opposite to the side of the substrate film 110.

In the manufacturing method according to this example, the activation treatment is applied to the surface 110D of the substrate film 110 made of an alicyclic olefin resin (step I). The activation treatment is also applied to a surface 120U of the protection film 120 made of an alicyclic olefin resin (step II).

The substrate film 110 and the protection film 120 are laminated in such a manner that the surfaces 110D and 120U to which the activation treatment is applied are brought into contact with each other (step III). The lamination of the substrate film 110 and the protection film 120 may be performed by compressing these films with, if necessary, applying heat. In this manner, the support film 100 as illustrated in FIG. 1 is obtained.

It is preferable that such a support film 100 is manufactured as a long-length product by a roll-to-roll operation. This product may be wound up to be in a form of a roll, before subjecting to the subsequent step. By providing the support film 100 as a roll, the support film 100, having the long-length form, can be easily fed into the apparatus that performs its operation at a reduced pressure.

Figure 2:
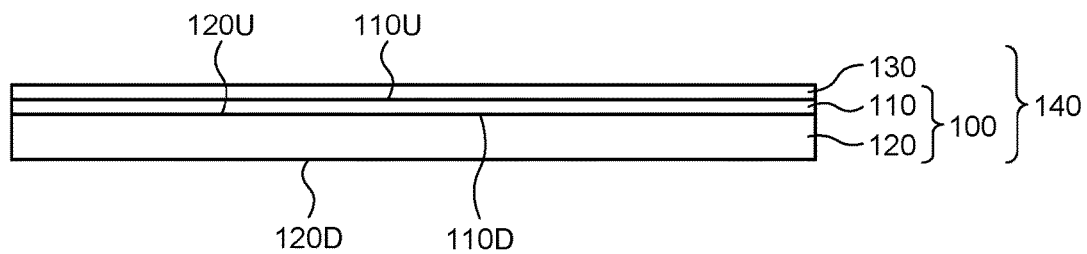
FIG. 2 is a sectional view schematically illustrating an example of a layer structure of an intermediate product film, used in the manufacturing method according to the example of the present invention.

FIG. 2 is a sectional view schematically illustrating an example of a layer structure of an intermediate product film used in the manufacturing method according to the example of the present invention.

As described earlier, after the substrate film 110 and the protection film 120 are laminated, an inorganic layer 130 is formed on a surface 110U of the substrate film 110 disposed on the support film 100 on the side opposite to the side of the protection film 120 (step IV). The inorganic layer 130 may be formed by an operation such as vapor deposition, e.g., CVD, or sputtering. In this manner, an intermediate product film 140 including the protection film 120, the substrate film 110, and the inorganic layer 130 in this order as illustrated in FIG. 2 may be obtained.

Figure 3:
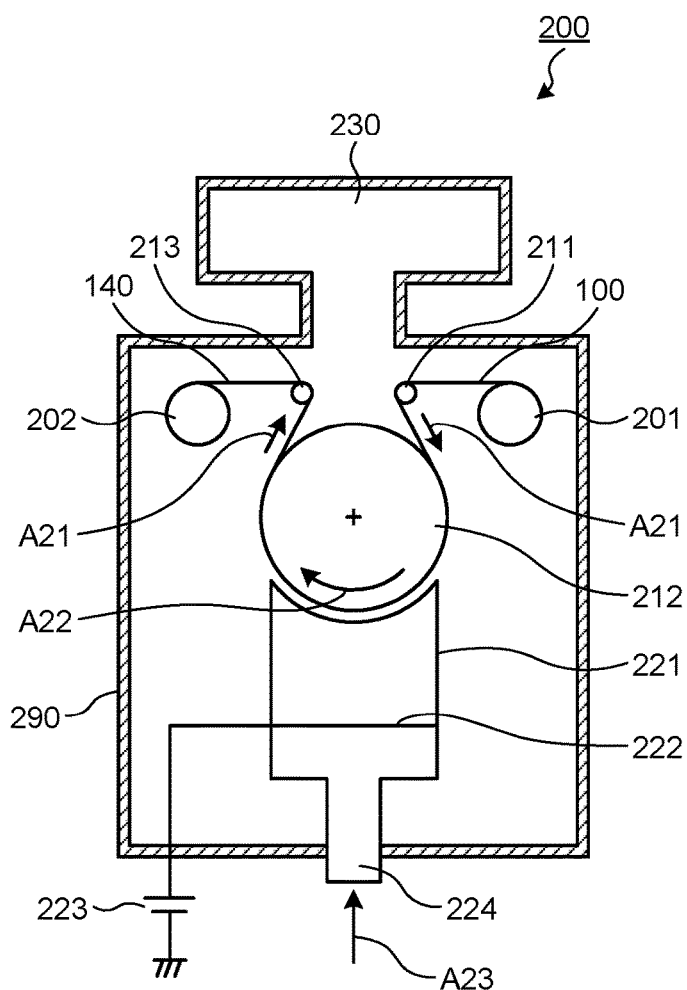
FIG. 3 is a sectional view illustrating an example of an apparatus for forming the inorganic layer by a CVD method.

A specific example of a step for forming the inorganic layer 130 will now be explained with reference to an exemplary apparatus for performing the step. FIG. 3 is a sectional view illustrating an example of a film forming apparatus for forming the inorganic layer 130 by the CVD method. In FIG. 3, a film forming apparatus 200 is a plasma CVD apparatus of film-winding type, and performs a series of operations of continuously forming the inorganic layer 130 by CVD onto the support film 100 fed from the roll 201 of the support film 100 to thereby produce an intermediate product film 140, and winding the intermediate product film 140 as a roll 202.

The film forming apparatus 200 has a guide roll 211, a can roll 212, and a guide roll 213, which are capable of guiding the fed support film 100 in a direction indicated by arrows A21, for subjecting the support film 100 to a step of forming the inorganic layer 130. By adjusting the positions of the guide roll 211, the can roll 212, and the guide roll 213, and adjusting the tensile force applied to the support film 100 by these rollers appropriately, the support film 100 is held closely attached to the can roll 212 while the support film 100 is guided by the can roll 212.

The can roll 212 is rotated in a direction indicated by an arrow A22, and the support film 100 thereon is conveyed at a distance close to a reaction tube 221. An electric power from an electric power supply 223 is applied to an electrode 222, and the can roll 212 is grounded via an appropriate grounding member (not illustrated). Further, a gas which is the material of the inorganic layer 130 is introduced via a gas inlet 224 toward a direction of an arrow A23. In this manner, the inorganic layer 130 can be formed continuously on the surface of the support film 100. This series of steps is carried out in a space surrounded by a vacuum chamber 290. The pressure in the vacuum chamber 290 may be adjusted to a pressure suitable for CVD by reducing the pressure by the operation of a vacuum air discharger 230.

When these steps are performed with a high output power in prior art, floating of the substrate film off the can roll 212 often occurs, and it has been difficult to continuously form a high-quality inorganic layer. Furthermore, because the inorganic layer formation with high-output power has been often carried out at a high temperature, use of a thin substrate film has sometimes brought about deterioration in quality of the substrate film due to the thermal damage given to the substrate film, which has hindered stable formation of the inorganic layer. Moreover, in general, because a substrate film having a high optical performance usually has a smooth surface, blocking has occurred frequently. By contrast, the manufacturing method according to this example can prevent floating, deterioration, and blocking of the support film 100, because a specific protection film 120 is provided on the surface of the substrate film 110. Blocking can be effectively prevented, particularly, in a configuration in which a slip facilitation layer is provided on the surface of the protection film.

Furthermore, although a film such as a substrate film and a protection film made of an alicyclic olefin resin generally has a low adhesion property, the manufacturing method according to this example can prevent the substrate film 110 and the protection film 120 from being peeled off from each other even in an environment in which the inorganic layer 130 is formed with a high output power, because the substrate film 110 and the protection film 120 are laminated using the surfaces 110D and 120U that are the surfaces of the substrate film 110 and the protection film 120 to which the activation treatment is applied.

Therefore, the manufacturing method according to this example enables a high-quality inorganic layer 130 to be formed continuously and efficiently.

Figure 4:
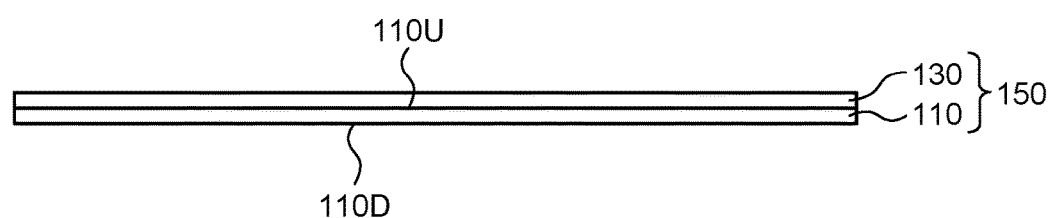
FIG. 4 is a sectional view schematically illustrating an example of a layer structure of a composite film that can be manufactured by the manufacturing method according to the example of the present invention.

FIG. 4 is a sectional view schematically illustrating an example of a layer structure of a composite film 150 that can be manufactured using the manufacturing method according to the example of the present invention.

As described earlier, after the inorganic layer 130 is formed on the surface 110U of the substrate film 110, the protection film 120 is peeled off from the substrate film 110 (step V). As a result, a composite film 150 including the substrate film 110 and the inorganic layer 130, as illustrated in FIG. 4, can be manufactured.

When the protection film is laminated to the substrate film via, e.g., a layer of adhesive agent or pressure-sensitive adhesive agent, such a lamination hinders smooth peeling of the protection film off from the substrate film. With the manufacturing method according to this example, however, because the substrate film 110 is laminated directly onto the protection film 120 using the surfaces 110D and 120U to which the activation treatment is applied, the protection film 120 can be peeled off easily and smoothly. Consequently, the composite film 150 can be manufactured efficiently.

The manufacturing method explained in the aforementioned example may also be implemented with further modifications.

For example, after the inorganic layer 130 is formed, another additional layer may be formed on a surface 130U of the inorganic layer 130, on the side opposite to the side of the substrate film 110, before the protection film 120 is peeled off from the substrate film 110. To explain with a specific example, a barrier layer may be at first formed as the inorganic layer 130, and an electroconductive membrane (not illustrated) may then be formed on the surface 130U of the inorganic layer 130.

As another example, another layer may be formed on the composite film 150 after peeling off the protection film 120 from the substrate film 110.

[6. Applications]

Exemplary applications of the composite film manufactured by the aforementioned manufacturing method may include: use in a variety of display devices, such as a display device having an organic EL element, a liquid crystal display device, and an electronic paper; light source devices such as an illumination light source device; and devices such as a solar cell. In such applications, a composite film having a barrier layer as the inorganic layer may be used as a sealing film having a barrier function for preventing permeation of moisture and oxygen in order to protect, e.g., an element included in such a device. As another example, a composite film having an electroconductive membrane as the inorganic layer may be used as an electrode or wiring provided to such a device.

EXAMPLES

The present invention will now be explained with reference to Examples. However, the present invention is not limited to the following Examples, and may be implemented with any modifications within the scope not deviating from the scope of the present invention and the equivalent thereto.

In the following explanation, "%" and "parts" that represent amounts are on the weight basis, unless specified otherwise. The operations described in the following were carried out in an atmospheric air at an ordinary temperature and ordinary pressure, unless specified otherwise. In the following explanation, "sccm" is a unit of gas flow with which the volume of gas that flows per one minute is represented by the volume (cm$^3$) of that gas at 25° C. and 1 atm.

[Measurement Methods]

(Method for Measuring Water Vapor Transmission Rate of Barrier Layer)

The water vapor transmission rate of the barrier layer was measured using "DELTAPERM" manufactured by Technolox Ltd.

(Method for Measuring Surface Resistance of Electroconductive Membrane)

The surface resistance of the electroconductive membrane was measured using "Loresta-GP" manufactured by Mitsubishi Chemical Analytech Co., Ltd.

(Method for Measuring Pure Water Contact Angle of Resin Film Surface)

The contact angle was measured by dropping pure water on the resin film surface and measuring the contact angle using a contact angle meter ("Drop Master DM500" manufactured by Kyowa Interface Science Co., Ltd), five seconds after dropping the pure water.

Example 1

(1-1. Manufacture of COP Substrate)

Pellets made of an alicyclic olefin resin ("ZEONOR 1430R" manufactured by ZEON Corporation, grass-transition temperature of 138° C.) were allowed to melt using a short axis extruder at a temperature of 240° C., and were melt-extruded from a T-shaped die at a temperature of 240° C., to thereby manufacture a long-length resin film 1 (thickness 188 μm) and a long-length resin film 2 (thickness 47 μm).

(1-2. Manufacture of Water-Based Resin Composition)

Water dispersion of polyurethane as a polymer having a polar group ("SuperFlex 210" manufactured by DKS Co. Ltd., an ester-based polyurethane resin including a carboxy group), was weighed in an amount such that the weighed water dispersion includes 100 parts of polyurethane. To that water dispersion, 20 parts of an epoxy compound ("Denacol EX-521" manufactured by Nagase ChemteX Corporation), 5 parts of sebacic acid dihydrazide, and 8 parts of silica particles (average particle diameter 100 nm), and water were blended, to thereby obtain liquid water-based resin composition 1 having a solid content of 5%.

(1-3. Formation of Slip Facilitation Layer)

Discharge treatment was applied to one surface of the resin film 1 under the conditions of an output power of 300 W, an electrode length of 240 mm, a work electrode pitch of 3.0 mm, and a conveyance speed of 4 m/min, using a corona treatment apparatus (manufactured by Kasuga Electric Works).

The water-based resin composition 1 was then applied onto the discharge-treated surface of the resin film 1 using a roll coater in such a manner that the dried film thickness would be 0.5 μm. Then the applied water-based resin composition 1 was dried at 140° C. for 40 seconds, to thereby form a slip facilitation layer on the surface of the resin film 1.

(1-4. Lamination of Resin Films)

To the resin film 1 on which the slip facilitation layer was thus formed, atmospheric pressure plasma surface treatment was performed as an activation treatment. The treatment was performed on a surface that is opposite to the side of slip facilitation layer. The atmospheric pressure plasma surface treatment was also performed to one surface of the resin film 2 as an activation treatment. The atmospheric pressure plasma surface treatment was carried out using an atmospheric pressure plasma surface treatment apparatus ("AP-T03-L" manufactured by Sekisui Chemical Co. Ltd.), under the conditions of an output power of 1.5 kW, a frequency of 25 kHz, a nitrogen gas flow rate of 50 L/min., and an irradiation speed of 30 cm/min. The contact angle of the surface to which the activation treatment was applied was measured using some parts of the resin film 1 and the resin film 2 to which the activation treatment was applied.

The surface of the resin film 1 to which the activation treatment was applied and the surface of the resin film 2 to which the activation treatment was applied were then brought into contact with each other, and compressed with a laminator ("ML-300T" manufactured by MCK). The conditions for this lamination were set to a pressure of 0.4 MPa and a temperature of 130° C. In this manner, a laminate film A including the resin film 2 serving as the substrate film, the resin film 1 serving as the protection film, and the slip facilitation layer in this order was produced.

(1-5. Formation of Barrier Layer (CVD))

On a surface of the laminate film on the side facing the resin film 2, a barrier layer was formed by CVD. The operation of forming the barrier layer was carried out using the film forming apparatus illustrated in FIG. 3 (the film-winding plasma CVD apparatus). The barrier layer was formed as an inorganic layer through RF plasma discharge under the conditions of a tetramethylsilane (TMS) flow rate of 10 sccm, an oxygen ($O_2$) flow rate of 100 sccm, an output power of 0.8 kW, a total pressure of 5 Pa, a film conveyance speed of 0.5 m/min. As a result, a barrier layer made of SiOx and having a thickness of 300 nm was formed, and a laminate film B having a layer structure of (barrier layer)/(resin film 2)/(resin film 1)/(slip facilitation layer) was thus obtained. The water vapor transmission rate of the barrier layer was measured, and found out to be 0.03 g/m$^2$/day or less. The laminate film B thus obtained was then wound into a roll.

The state of the laminate film A during the inorganic layer formation, and the state of the roll of the wound laminate film B were observed, and the suitability for the roll-to-roll operation (presence or absence of floating of the film off the conveying roller) and the suitability for film formation (presence or absence of delamination of the protection film) were evaluated in accordance with the following evaluation criteria.

Suitability for Roll-to-Roll (R2R) Operation

Good—No blocking occurred, and no floating of the film off the conveying roller occurred.

Bad—Conveyance was obstructed due to blocking or floating of the film off the conveying roller.

Suitability for Film Formation

Good—The protection film was not peeled off when exposed to high temperature during the CVD.

Bad—The protection film was peeled off when exposed to high temperature during the CVD.

(1-6. Formation of Electroconductive Membrane (Sputtering))

On the surface of the laminate film B on the side facing the barrier layer, an electroconductive membrane was formed by sputtering. The operation of forming the electroconductive membrane was carried out using a film-winding magnetron sputtering apparatus. As the sputtering target, an $In_2O_3$—$SnO_2$ ceramic target was used. Other conditions for forming the electroconductive membrane were an argon (Ar) flow rate of 150 sccm, an oxygen ($O_2$) flow rate of 10 sccm, an output power of 4.0 kW, a degree of vacuum of 0.3 Pa, and a film conveyance speed of 0.5 m/min. As a result, an electroconductive membrane made of ITO and having a thickness of 100 nm was formed, and a laminate film C having a layer structure of (electroconductive membrane)/ (barrier layer)/(resin film 2)/(resin film 1)/(slip facilitation layer) was thus obtained. The surface resistance of the electroconductive membrane was measured, and found out to be 50Ω/□ or less. The laminate film C thus obtained was then wound in a roll.

The state of the laminate film B during the electroconductive membrane formation and the state of the roll of the wound laminate film C were observed, and the suitability for the roll-to-roll operation (presence or absence of floating of the film off the conveying roller) and the suitability for film formation (presence or absence of delamination of the protection film) were evaluated in accordance with the following evaluation criteria.

Suitability for Roll-to-Roll (R2R) Operation

Good—No blocking occurred, and no floating of the film off the conveying roller occurred.

Bad—Conveyance was obstructed due to blocking or floating of the film off the conveying roller.

Suitability for Film Formation

Good—The protection film was not peeled off when exposed to high temperature during the sputtering.

Bad—The protection film was peeled off when exposed to high temperature during the sputtering.

(1-7. Peeling of Protection Film)

In a highly humid environment, the resin film 1 serving as the protection film was peeled off from the resin film 2 serving as the substrate film of the laminate film C, and a composite film having a layer structure of (electroconductive membrane)/(barrier layer)/(resin film 2) was thus obtained. Peeling of the resin film 1 was smoothly performed.

Example 2

Corona treatment was applied, instead of the atmospheric pressure plasma surface treatment, as the activation treatment of the surface of the resin film 1 on the side opposite to the side of the slip facilitation layer, and the one surface of the resin film 2 at the step (1-4). The corona treatment was carried out under the conditions of an output power of 0.6 kW and a treatment speed of 5 m/min.

Laminate films B and C, and a composite film were manufactured and evaluated in the same manner as in Example 1 except for the aforementioned matter.

Example 3

Ultraviolet (UV) ozone treatment was applied, instead of the atmospheric pressure plasma surface treatment, as the activation treatment of the surface of the resin film 1 on the side opposite to the side of the slip facilitation layer, and the one surface of the resin film 2 at the step (1-4). This UV ozone treatment was carried out under the conditions of radiation time of 5 m/min, and a radiation distance of 10 mm.

Laminate films B and C, and a composite film were manufactured and evaluated in the same manner as in Example 1 except for the aforementioned matter.

Example 4

Combustion chemical vapor deposition was applied, instead of the atmospheric pressure plasma surface treatment, as the activation treatment of the surface of the resin film 1 on the side opposite to the side of the slip facilitation layer, and the one surface of the resin film 2 at the step (1-4). This combustion chemical vapor deposition was carried out using a silicification flame treatment apparatus, under the condition of a treatment speed of 1000 mm/sec, with a flame of fuel gas containing 1,2-dichlorotetramethylsilane as a silane compound.

Laminate films B and C, and a composite film were manufactured and evaluated in the same manner as in Example 1 except for the aforementioned matter.

Example 5

The resin film 2 manufactured at the step (1-1) was stretched using a tenter under the conditions of 140° C. and a film conveyance speed of 20 m/min. This tenter included grippers capable of gripping the both width-direction ends of the film, and rails capable of guiding the grippers. The rails of this tenter were set so that the film after the stretching has a slow axis inclined by 45° with respect to the flowing direction. In this manner, a stretched film having a thickness of 23 μm, and a slow axis at an angle of 45° C. with respect to the flow direction was obtained. The stretched film thus obtained was used as a substitute for the resin film 2.

Laminate films B and C, and a composite film were manufactured and evaluated in the same manner as in Example 1 except for the aforementioned matter.

Comparative Example 1

The activation treatment applied to the surface of the resin film 1 on the side opposite to the side of the slip facilitation layer, and the one surface of the resin film 2 at the step (1-4) was omitted.

The inventor attempted to manufacture and to evaluate laminate films B and C, and a composite film, in the same manner as in Example 1 except for the aforementioned matter. However, a fine barrier layer was not obtained at step (1-5), and therefore, the electroconductive membrane could not be formed on the barrier layer. Hence, although the evaluation up to the step (1-5) was performed, the steps (1-6) and (1-7) were omitted.

Comparative Example 2

A film made of polycarbonate resin ("Panlite sheet PC-2515" manufactured by Teijin, thickness 125 μm) was used as the resin film 1, instead of the film made of the alicyclic olefin resin.

The inventor attempted to manufacture and to evaluate laminate films B and C, and a composite film, in the same manner as in Example 1 except for the aforementioned matter. However, a fine barrier layer was not obtained at step (1-5), and therefore, the electroconductive membrane could not be formed on the barrier layer. Hence, although the evaluation up to the step (1-5) was performed, the steps (1-6) and (1-7) were omitted.

Comparative Example 3

A film made of polyethylene resin ("Toretec 7332" manufactured by Toray Advanced Film, thickness 250 μm) was used as the resin film 1, instead of the film made of the alicyclic olefin resin.

The inventor attempted to manufacture and to evaluate laminate films B and C, and a composite film, in the same manner as in Example 1 except for the aforementioned matter. However, a fine barrier layer was not obtained at step (1-5), and therefore, the electroconductive membrane could not be formed on the barrier layer. Hence, although the evaluation up to the step (1-5) was performed, the steps (1-6) and (1-7) were omitted.

[Results]

The results of Examples and Comparative Examples described above are given in Table 1 and Table 2. In Table 1 and Table 2, the values of the contact angle are a pure water contact angle of the surfaces to be laminated. The meaning of the abbreviations used in Table 1 and Table 2 are as follows.

COP: alicyclic olefin resin
PC: polycarbonate resin
PE: polyethylene resin

TABLE 1

Results of Examples and Comparative Examples

| | Substrate film | | Protection film | | |
|---|---|---|---|---|---|
| | Resin | Contact angle (°) | Resin | Contact angle (°) | Activation treatment |
| Ex. 1 | Unstretched COP | 41 | COP | 38 | Plasma |
| Ex. 2 | Unstretched COP | 32 | COP | 35 | Corona |
| Ex. 3 | Unstretched COP | 30 | COP | 33 | UV ozone |
| Ex. 4 | Unstretched COP | 45 | COP | 40 | Combustion chemical vapor deposition |
| Ex. 5 | Stretched COP | 29 | COP | 33 | Plasma |
| Comp. Ex. 1 | COP | 90 | COP | 92 | None |
| Comp. Ex. 2 | COP | 45 | PC | 37 | Plasma |
| Comp. Ex. 3 | COP | 44 | PE | 36 | Plasma |

TABLE 2

Results of Examples and Comparative Examples

| | CVD R2R suitability | CVD film formation suitability | Sputtering R2R suitability | Sputtering film formation suitability |
|---|---|---|---|---|
| Ex. 1 | Good | Good | Good | Good |
| Ex. 2 | Good | Good | Good | Good |
| Ex. 3 | Good | Good | Good | Good |
| Ex. 4 | Good | Good | Good | Good |
| Ex. 5 | Good | Good | Good | Good |
| Comp. Ex. 1 | Bad | Bad | — | — |
| Comp. Ex. 2 | Good | Bad | — | — |
| Comp. Ex. 3 | Good | Bad | — | — |

DISCUSSION

As seen in Table 2, in all of Examples, fine inorganic layers were successfully manufactured in a stable manner. Based on these results, it was confirmed that the present invention enables formation of an inorganic layer on a thin substrate film with a high output power.

REFERENCE SIGNS LIST

100 Support film (laminate film before the inorganic layer is formed)
110 Substrate film
110D Surface of substrate film
110U Surface of substrate film
120 Protection film
120D Surface of protection film
130 Inorganic layer
130U Surface of inorganic layer
140 Intermediate product film (laminate film with inorganic layer)
150 Composite film
200 Film forming apparatus
201 Roll of multi-layered product
202 Roll of laminate film
211 Guide roll
212 Can roll
213 Guide roll
221 Reaction tube
222 Electrode
223 Electrode
224 Gas inlet
230 Vacuum air discharger
290 Vacuum chamber

The invention claimed is:

1. A laminate film comprising:
a substrate film made of an alicyclic olefin resin; and
a protection film made of an alicyclic olefin resin and disposed directly on one surface of the substrate film, wherein
a surface of the substrate film on a side brought into contact with the protection film, or a surface of the protection film on a side brought into contact with the substrate film is a surface to which activation treatment is applied,
a thickness of the protection film is thicker than a thickness of the substrate film; and
the thickness of the protection film is 100 μm or more.

2. The laminate film according to claim 1, wherein the activation treatment is at least one selected from the group consisting of plasma treatment, corona treatment, ultraviolet ozone treatment, and combustion chemical vapor deposition.

3. The laminate film according to claim 1, further comprising an inorganic layer on a surface of the substrate film on a side opposite to the side of the protection film.

4. The laminate film according to claim 3, wherein the inorganic layer includes at least one selected from the group consisting of metal oxide, metal nitride, and metal oxide nitride.

5. The laminate film according to claim 3 wherein the inorganic layer includes a barrier layer.

6. The laminate film according to claim 3, wherein the inorganic layer includes an electroconductive membrane.

7. The laminate film according to claim 1, wherein the surface to which the activation treatment is applied has a pure water contact angle of less than 80°.

8. The laminate film according to claim 1, wherein the thickness of the protection film is 300 μm or less.

9. The laminate film according to claim 1, wherein the thickness of the protection film is 120 μm or more, and 200 μm or less.

10. The laminate film according to claim 1, wherein a ratio T2/T1 of a thickness T2 of the protection film with respect to a thickness T1 of the substrate film is 1.1 or more.

11. The laminate film according to claim 1, wherein a ratio T2/T1 of a thickness T2 of the protection film with respect to a thickness T1 of the substrate film is 1.25 or more, and 4 or less.

12. A method for manufacturing a composite film including a substrate film and an inorganic layer, the method comprising:

forming an inorganic layer on a surface of a laminate film, the laminate film including a substrate film made of an alicyclic olefin resin and a protection film that is made of an alicyclic olefin resin and that is disposed directly on one surface of the substrate film, the surface of the laminate film being a surface of the substrate film on a side opposite to a side of the protection film; and peeling off the protection film from the substrate film, wherein a surface of the substrate film on a side brought into contact with the protection film, or a surface of the protection film on a side brought into contact with the substrate film is a surface to which activation treatment is applied, a thickness of the protection film is thicker than a thickness of the substrate film; and the thickness of the protection film is 100 μm or more.

* * * * *